United States Patent
Chang et al.

(10) Patent No.: US 9,291,895 B2
(45) Date of Patent: Mar. 22, 2016

(54) BINDER COMPOSITION AND PROCESSES FOR THE PREPARATION THEREOF

(71) Applicant: Boe Technology Group Co., Ltd., Beijing (CN)

(72) Inventors: Shan Chang, Beijing (CN); Zhuo Zhang, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/529,269

(22) Filed: Oct. 31, 2014

(65) Prior Publication Data

US 2015/0331318 A1  Nov. 19, 2015

(30) Foreign Application Priority Data

May 15, 2014  (CN) .......................... 2014 1 0205429

(51) Int. Cl.
*G03F 7/033* (2006.01)
*G03F 7/038* (2006.01)
*C08F 220/18* (2006.01)

(52) U.S. Cl.
CPC ............ *G03F 7/0388* (2013.01); *C08F 220/18* (2013.01)

(58) Field of Classification Search
None
See application file for complete search history.

(56) References Cited

U.S. PATENT DOCUMENTS 5,308,530 A * 5/1994 Aronson .............. C11D 3/0036
510/321
2011/0244385 A1 * 10/2011 Fechner ............. C08G 65/3322
430/108.4

FOREIGN PATENT DOCUMENTS

| CN | 101046330 | 10/2007 |
| CN | 103145908 | 6/2013 |
| CN | 103467646 | 12/2013 |
| JP | 61-175642 A | * 8/1986 |
| JP | 2000-265083 A | * 9/2000 |

OTHER PUBLICATIONS

English translation of JP, 2000-265083, A (2000) from machine translation from AIPN Japan Patent Office National Center for Industrial Property Information and Training, generated May 18, 2015, 9 pages.*
English abstract of JP 61175642 publication date Aug. 1986, from SciFinder database, Accession No. 1987:76233. 3 pages.*
Office action from Chinese Application No. 201410205429.4 dated Sep. 29, 2015.

* cited by examiner

Primary Examiner — Cynthia Hamilton
(74) Attorney, Agent, or Firm — Calfee, Halter & Griswold LLP

(57) ABSTRACT

The general inventive concepts relate to an alkali soluble binder which is obtained by copolymerizing main polymerization monomer(s) and functional polymerization monomer, wherein said main polymerization monomer is selected from the group consisting of (meth)acrylic acid and esters thereof, and said functional polymer monomer comprises (meth)acrylic acid C14-C22 alkyl ester and C4-C6 alkenyl anhydride or dianhydride. The general inventive concepts further relate to a photosensitive binder composition and a process for producing the alkali soluble binder and a process for producing the photosensitive binder composition.

14 Claims, 2 Drawing Sheets

BINDER COMPOSITION AND PROCESSES FOR THE PREPARATION THEREOF

RELATED APPLICATIONS

The present application claims the benefit of Chinese Patent Application No. 201410205429.4, filed May 15, 2014, the entire disclosure of which is incorporated herein by reference.

FIELD

The disclosure relates to the filed of display technology, and more particularly to an alkali soluble binder, a photosensitive binder composition comprising the alkali soluble binder and the process for preparing the same.

BACKGROUND

With the rapid development of flat-panel display technology, a display product whose picture is clear, colorful and vivid has drawn increasing attention and expectation from the public.

In order to provide these enhanced properties, improved binder compositions are desired. Regarding photosensitive binder compositions obtained by mixing a green pigment powder with a binder composition and the green photoresist prepared from the photosensitive binder composition, the binder compositions conventionally used are mostly composed of an alkali soluble binder, photopolymerizable monomer(s) containing a dipentaerythritol group, a photoinitiator, a levelling agent and a solvent; the conventional green pigment powder is usually G36; when they are mixed together, the G36 pigment powder can be dispersed into the photosensitive binder composition system relatively well but the green photoresist prepared thereby is barely satisfactory in terms of contrast and colour gamut. Therefore, in order to improve the effect of green photoresist in terms of contrast and colour gamut, competitive photoresist manufacturers use superior green pigment powder to produce photoresist having higher contrast. With smaller particle size and greater brightness, G58 green pigment powder stands out from high-performance green photoresists.

However, G58 green pigment is a pigment powder which cannot be easily refined. After being dispersed stably, it usually cannot be easily matched with the existing photosensitive binder composition formulation system and can easily cause problems such as poor heat resistance, poor development properties, rough pixel surface, and marginal residue. Alkali soluble binder is one of the most important components of the photosensitive binder composition in the original photosensitive binder composition formulation and plays a relatively essential role in solving problems of the composition such as poor heat resistance. Therefore, there is still a need for a new alkali soluble binder for producing a photosensitive binder composition having excellent properties such that G58 green pigment is better dispersed in the binder system.

It has surprisingly been found that if functional polymerization monomer(s) are added into the alkali soluble binder, the functional polymerization monomer(s) can not only introduce alkyl and anhydride into the alkali soluble binder so as to adjust its polymerization degree and viscosity but also resolve problems of the binder such as poor heat resistance, rough pixel surface, marginal residue. It can also be subjected to a neutralization reaction with alkali solvent during the course of alkali development so as to improve the development effect of alkali soluble binder, such that G58 green pigment having a smaller particle size is better dispersed in the alkali soluble binder and a photosensitive binder composition having enhanced properties is further formed.

SUMMARY

The general inventive concepts relate to an alkali soluble binder (or alkali soluble resin) which is obtained by copolymerizing main polymerization monomer(s) and functional polymerization monomer(s), wherein said main polymerization monomer(s) are selected from (meth)acrylic acid and ester(s) thereof, and said functional polymer monomer(s) comprise(s) (meth)acrylic acid C14-C22 alkyl ester and C4-C6 alkenyl anhydride or dianhydride.

The general inventive concepts also relate to a process for producing the alkali soluble binder.

The general inventive concepts also relate to a photosensitive binder composition, wherein said photosensitive binder composition comprises the alkali soluble binder of the invention and a pigment.

The general inventive concepts also relate to a process for producing the photosensitive binder composition such that a pigment, especially G58 green pigment is better dispersed in the photosensitive binder composition (or photosensitive resin composition) and a photoresist having better properties is prepared.

BRIEF DESCRIPTION OF THE DRAWINGS

Several technical aspects of the present disclosure will be described in more detail below with reference to the accompanying drawings in order for those skilled in the art to be able to carry out the embodiments of present disclosure. The present disclosure may, however, be embodied in many different forms and should not be construed as limited to the exemplary embodiments set forth herein. In particular, the general inventive concepts are not intended to be limited by the various illustrative embodiments disclosed herein.

DETAILED DESCRIPTION

Figure 1:
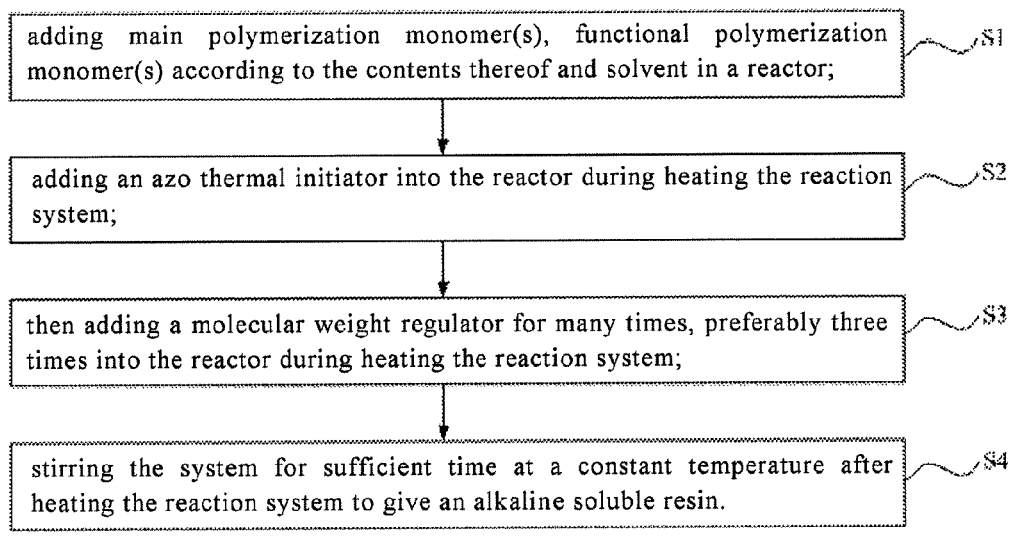
FIG. 1 illustrates a flow diagram of a process for producing the alkali soluble binder according to the disclosure.

Various embodiments will be further described in detail in conjunction with the drawings. The embodiments described herein are provided merely for illustration and are not intended to limit the scope of the claims. Those of skill in the art will recognize that various other modifications and combinations are possible and still fall within the scope of the general inventive concepts.

The technical solutions disclosed in the disclosure will be described clearly and completely by referring to FIGS. 1 and 2 in the following text. However, any amendments and modifications made by those skilled in the art according their basic knowledge based on the contents disclosed in the disclosure are not outside of the scope of the disclosure.

In a first exemplary embodiment, the disclosure concerns an alkali soluble binder, which is obtained by copolymerizing main polymerization monomer(s) and functional polymerization monomer(s), wherein said main polymerization monomer(s) is (are) selected from the group consisting of (meth)acrylic acid and ester(s) thereof, and said functional polymer monomer(s) comprise(s) (meth)acrylic acid C14-C22 alkyl ester, preferably (meth)acrylic acid C16-C20 alkyl ester, and C4-C6 alkenyl anhydride (in certain embodiments, the C4-C6 alkenyl anhydride is a dianhydride).

According to an exemplary embodiment of the alkali soluble binder, the ratio by weight of said (meth)acrylic acid C14-C22 alkyl ester to said C4-C6 alkenyl anhydride is from about 2:1 to about 1:4. Preferably the ratio by weight of said (meth)acrylic acid C14-C22 alkyl ester to said C4-C6 alkenyl anhydride is about 1:1.

According to an exemplary embodiment of the alkali soluble binder, the (meth)acrylic acid C14-C22 alkyl ester is stearyl methacrylate. In certain embodiments, the C4-C6 alkenyl anhydride is maleic anhydride.

According to an exemplary embodiment of the alkali soluble binder, the (meth)acrylic ester(s) used as the main polymerization monomer is (are) selected from the group consisting of (meth)acrylic acid C1-C6 alkyl ester, (meth) acrylic acid C7-C10 aralkyl ester and mixtures thereof. In certain embodiments, the (meth)acrylic acid(s) and ester(s) thereof mainly comprise or consist of methacrylic acid, methyl methacrylate, butyl methacrylate and benzyl methacrylate.

In context of the disclosure, the expression "mainly comprise" means the content(s) of the component(s) is(are) more than 50%, preferably 75%, or even 90% of the total amount.

According to an exemplary embodiment, the alkali soluble binder is prepared by the copolymerization of the following monomers of the following percent contents, relative to the total weight of said monomers:
(meth)acrylic acid: 3 to 25%;
(meth)acrylic acid C1-C6 alkyl ester: 13% to 75%;
(meth)acrylic acid C7-C10 aralkyl ester: 10% to 50%;
(meth)acrylic acid C14-C22 alkyl ester: 0.75% to 30%;
C4-C6 alkenyl anhydride or dianhydride: 3% to 15%.

In certain embodiments, for the (meth)acrylic acid C7-C10 aralkyl ester, the C7-C10 aralkyl is selected from aralkyl containing phenyl, preferably benzyl, phenylethyl, particularly benzyl. In certain embodiments, the C4-C6 alkenyl is maleic anhydride.

According to an exemplary embodiment, the alkali soluble binder is prepared by the copolymerization of the following monomers of the following percent contents, relative to the total weight of said monomers:
methacrylic acid: 3 to 25%;
methyl methacrylate: 3% to 40%;
butyl methacrylate: 10% to 35%;
benzyl methacrylate: 10% to 50%;
stearyl methacrylate: 0.75% to 30%
maleic anhydride: 3% to 15%.

According to an exemplary embodiment, the alkali soluble binder has a weight-average molecular weight of 8000 to 25000, 12000-20000.

According to an exemplary embodiment, the alkali soluble binder has a solid acid value of 400±10.

According to an exemplary embodiment, the alkali soluble binder has a viscosity of 120-150 cps, which is measured at 23° C. through a conventional operation process on BROOK-FILED DV_C Digital Viscometer.

Alkali soluble binder is one of the most important components of the photosensitive binder composition and plays a relatively essential role in solving the problem of the conventional photosensitive binder composition such as poor heat resistance. In the prior art, alkali soluble binder is usually formed by polymerizing the main polymerization monomer(s). Different from the alkali soluble binder in the prior art, the polymerization monomer(s) disclosed in the disclosure comprise(s) not only the main polymerization monomer(s) but also the functional polymerization monomer(s).

The main polymerization monomer(s) mainly comprise(s) or consist(s) of methacrylic acid, methyl methacrylate, butyl methacrylate and benzyl methacrylate. The functional polymerization monomer(s) mainly comprise(s) or consist(s) of stearyl methacrylate and maleic anhydride. When the functional polymerization monomer(s) and the main polymerization monomer(s) are polymerized under initialization by azo thermal initiators, the obtained alkali soluble binder may comprise not only alkyl(s), aryl(s) provided by the main polymerization monomer(s) but also anhydride and long alkyl chain(s) provided by the functional polymerization monomer(s). Hence, by bonding of double bonds in unsaturated groups to each other, a pigment, especially G58 green pigment will be better dispersed therein to obtain a more stable system. It should be indicated that (meth)acrylic acid and ester(s) thereof may comprise only (meth)acrylic acid and they may also comprise (meth)acrylic acid and a variety of ester compounds thereof. Those skilled in the art may make a selection in view of actual circumstance during application. Within the scope of the disclosure, it is preferable to use a mixture of (meth)acrylic acid and ester(s) thereof.

Since the functional polymerization monomer(s) is (are) copolymerized into the alkali soluble binder of the disclosure, as compared with the alkali soluble binder in the prior art, the functional polymerization monomer(s) can not only introduce alkyl and anhydride into the alkali soluble binder to adjust its polymerization degree and viscosity and to resolve the problems such as poor heat resistance, rough pixel surface, marginal residue, but also improve the development effect of alkali soluble binder by a neutralization reaction of the binder with the alkali solvent during the course of alkali development, such that a pigment powder having a smaller particle size, such as G58 green pigment powder is better dispersed in the alkali soluble binder and a photosensitive binder composition having superior properties is formed.

It has also been found that, for the functional polymerization monomer(s) in the disclosure, the ratio of (meth)acrylic acid C14-C22 alkyl ester to C4-C6 alkenyl anhydride has an important impact on the compatibility and the viscosity of the formed alkali soluble binder. Without being bound to a certain theory, since in the alkali soluble binder structure, the effect of C4-C6 alkenyl anhydride and (meth)acrylic acid C14-C22 alkyl ester may have contrary effects on the compatibility of alkali soluble binder and on the viscosity of alkali soluble binder, i.e. since the (meth)acrylic acid C14-C22 alkyl ester is of a long-chain structure and when the content thereof is relatively high, the polymerization degree is relatively high, and the viscosity of the formed alkali soluble binder is relatively high, but the alkali development effect is relatively poor; by contrast, when the content of C4-C6 alkenyl anhydride is relatively high, the viscosity and the alkali development effect of the formed alkali soluble binder are improved but the compatibility of the alkali soluble binder is relatively poor. A suitable ratio of the two monomers in the polymer chain of the alkali soluble binder may be selected to obtain an excellent compromise of the properties of the alkali soluble binder. According to an exemplary embodiment, the ratio by weight of said (meth)acrylic acid C14-C22 alkyl ester to said C4-C6 alkenyl anhydride is from about 2:1 to about 1:4. In certain embodiments the ratio by weight of said (meth)acrylic acid C14-C22 alkyl ester to said C4-C6 alkenyl anhydride is about 1:1.

According to an exemplary embodiment, the alkali soluble binder has a weight-average molecular weight of about 8000 to 25000, preferably about 12000-20000. According to an exemplary embodiment, the solid acid value of the alkali soluble binder is 400±10. According to an exemplary embodiment, the alkali soluble binder has a viscosity of about 20-150 cps, which is measured at 23° C. through the conventional operation process on BROOKFILED DV_C Digital Viscometer.

According to an exemplary embodiment, the alkali soluble binder is prepared by the copolymerization of the monomers of the following percent contents, relative to the total weight of said monomers: methacrylic acid: 8 to 17%; methyl methacrylate: 3% to 40%; butyl methacrylate: 20% to 25%; benzyl methacrylate: 10% to 50%; stearyl methacrylate: 5% to 10%; maleic anhydride: 5% to 10%.

Figure 2:
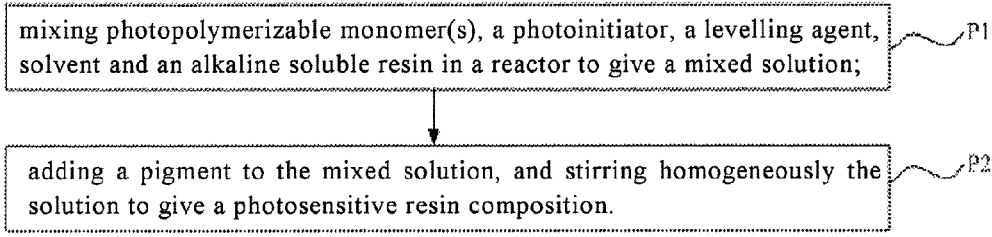
FIG. 2 illustrates a flow diagram of a process for producing the photosensitive binder composition according to the disclosure.

The disclosure further relates to a process for producing the alkali soluble binder as defined above, as shown in FIG. 1, the process comprising:

S1. adding the main polymerization monomer(s), the functional polymerization monomer(s) according to the contents of the monomer(s) and solvent into a reactor;
S2. adding an azo thermal initiator into the reactor while heating the reaction system;
S3. then adding a molecular weight regulator optionally, in at least one portion, in certain embodiments, three times, into the reactor during heating the reaction system;
S4. stirring the system for sufficient time at a constant temperature after heating the reaction system to give an alkali soluble binder.

The solvent used in the copolymerization reaction may be selected from conventional solvents in the art, such as propylene glycol monomethyl ether acetate.

In step S1, the operation is conducted under stirring at room temperature. According to the contents of the monomers, the main polymerization monomer(s) and the functional polymerization monomer(s), preferably methacrylic acid, methyl methacrylate, butyl methacrylate, benzyl methacrylate, maleic anhydride, stearyl methacrylate, and certain amount of solvent, preferably propylene glycol monomethyl ether acetate are weighed and added into a reactor. According to an exemplary embodiment, relative to the total weight of all monomers, the content of methacrylic acid is 3% to 25%; the content of methyl methacrylate is from 3% to 40%; the content of butyl methacrylate is from 10% to 35%; the content of benzyl methacrylate is from 10% to 50%; the content of stearyl methacrylate is from 0.75% to 30%; the content of maleic anhydride is from 3% to 15%. In certain embodiments, relative to the total weight of all monomers, the content of methacrylic acid is from 8% to 17%; the content of methyl methacrylate is from 3% to 40%; the content of butyl methacrylate is from 20% to 25%; the content of benzyl methacrylate is from 10% to 50%; the content of stearyl methacrylate is from 5% to 10%; the content of maleic anhydride is from 5% to 10%. It should be indicated that the solvent, such as propylene glycol monomethyl ether acetate is used to better dissolve and mix various materials, and to dissolve the azo thermal initiator before adding it, such that the initiator can better initiate the polymerization of the monomer materials. Thus, the amount of solvent is at least sufficient for completely dissolving the monomers and the azo thermal initiator.

In step S2, after adding the monomer component(s) and the solvent, the reaction system is heated under stirring at a fixed heating rate, for example, less than 5° C./minute, 1-4° C./minute, preferably 2-3° C./minute or at a changing heating rate. The azo thermal initiator is added either continuously or discontinuously during the heating. However, the azo thermal initiator is added into the reactor preferably within the first 15 minutes during heating the reaction system. The azo thermal initiator used is preferably azobisisobutyronitrile; the percentage by weight of the azo thermal initiator is from 2 to 5%, preferably 3% of the total weight of the polymerization monomer(s). The main effect of the azo thermal initiator is to initiate the polymerization of the monomer materials to form an alkali soluble binder. Therefore, its amount is not limited to the ranges disclosed above as long as it can sufficiently initiate polymerization. In regard to the manner of adding azo thermal initiator, those skilled in the art may add it into the reactor directly or in solution after predissolving it in the solvent; preferably it is added into the reactor after predissolving it in the solvent.

In step S3, in the course of heating the system under stirring, not only azo thermal initiator is added to initiate the polymerization but also molecular weight regulator is added to adjust the molecular weight of the resulting polymer such that the molecular weight of the finally formed alkali soluble binder can be in the desired range of molecular weight; wherein the molecular weight regulator used may be selected from conventional molecular weight regulators in the art, such as 1-dodecanethiol. The molecular weight regulator may be added into the heated system several times, preferably three times to obtain the alkali soluble binder having a searched molecular weight range. The addition amount of the molecular weight regulator is generally less than 10% of the total weight of the polymerization monomer(s).

In step S4, the reaction system is generally heated to less than 90° C., preferably from 65 to 80° C. such that the polymerization reaction is conducted rapidly and completely. After heating, the reaction system is stirred at a constant temperature for at least 2 hours, preferably 3 to 8 hours, more preferably 6 hours such that the formed alkali soluble binder is further bonded to form a more stable system. After the system is stable and the temperature is reduced to room temperature, the mixture is filtered to remove a small amount of solid residues contained in the raw materials, such that the resulting stable system is more homogeneous.

According to the process for producing the alkali soluble binder, an alkali soluble binder that is more stable and homogeneous and contains multiple functional group(s) is obtained by the copolymerization of the main polymerization monomer(s) and the functional polymerization monomer(s), such that the problems of the existing alkali soluble binder such as, relatively poor thermal resistance, rough pixel surface, marginal residue and poor development effect can be resolved, and the pigment powder having a smaller particle size, such as G58 green pigment powder can be better dispersed in the alkali soluble binder. The properties of the photosensitive binder composition obtained by the process are superior, so it can promote the study on green photoresist and improve the productivity thereof.

According to an exemplary embodiment of the process for producing the alkali soluble binder, the process comprises:
(1) adding methacrylic acid, methyl methacrylate, butyl methacrylate, benzyl methacrylate, maleic anhydride, stearyl methacrylate according to the contents of the monomers and a certain amount of solvent, propylene glycol monomethyl ether acetate into a reactor at room temperature under stirring;
(2) adding an azo thermal initiator dropwise into the reactor within the first 15 minutes during heating the reaction system;
(3) then adding a molecular weight regulator several times, optionally three times, into the reactor during heating the reaction system;
(4) stirring the system for at least 2 hours at a constant temperature after heating the reaction system; then cooling the system to room temperature, and filtering the system to give an alkali soluble binder.

The disclosure also relates to a photosensitive binder composition, the photosensitive binder composition comprises photopolymerizable monomer(s) containing dipentaerythritol group, photoinitiator, solvent, at least one alkali soluble binder as defined above, pigment and optionally a levelling agent.

According to an exemplary embodiment, in the photosensitive binder composition, the percentage by weight of the photopolymerizable monomer(s) containing dipentaerythritol group is from 30 to 50%, preferably from 40 to 45%. The percentage by weight of the at least one alkali soluble binder is from 30 to 60%, preferably from 40 to 55%, relative to the total weight of the photosensitive binder composition.

In certain embodiments, a levelling agent may be added to the photosensitive binder composition. The percentage by weight of the levelling agent is generally less than 5%, preferably from 1% to 4%, relative to the total weight of the photosensitive binder composition.

The content of the photoinitiator in the photosensitive binder composition is adjusted. Generally speaking, in the photosensitive binder composition of the disclosure, the percentage by weight of the photoinitiator is generally less than 10%, preferably from 1% to 7%, relative to the total weight of the photosensitive binder composition.

According to an exemplary embodiment, the photopolymerizable monomer(s) containing dipentaerythritol group may be selected from conventional photopolymerizable monomers in the art, preferably dipentaerythritol hexaacrylate.

According to an exemplary embodiment, the photoinitiator may be selected from the photoinitiators used in the art, preferably 2-benzyl-2,2 dimethylamino-1-(4-morpholinylphenyl)-1-butanone.

According to an exemplary embodiment, the levelling agent may be selected from that used in the art, particularly epoxy resin type levelling agents, preferably novolac type epoxy resin levelling agents, such as DEN438 novolac type epoxy resin.

According to an exemplary embodiment, the pigment may be selected from the pigments used in the art, especially the pigments having relatively small particle sizes, such as G58 green pigment. The addition amount of the pigment is adjusted according to actual need, for example, relative to the resulting photosensitive binder composition, is less than 20%, preferably from 10 to 18%.

According to an exemplary embodiment, the solvent used in the photosensitive binder composition is generally the same as that used in the production of alkali soluble binder, i.e., propylene glycol monomethyl ether acetate. However, using other suitable solvents does not go beyond the scope of the disclosure. The use amount of the solvent can be adjusted according to needs, as long as the composition is dissolved. Generally speaking, the amount of solvent is less than 40%, preferably from 10% to 30% of the total weight of the photosensitive binder composition.

According to an exemplary embodiment of the photosensitive binder composition, the photosensitive binder composition comprises: from 30 to 50% of photopolymerizable monomer(s) containing dipentaerythritol group, less than 10% of photoinitiator, less than 5% of levelling agent, less than 40% of solvent, from 30 to 60% of at least one alkali soluble binder as defined above, and less than 20% of pigment.

The disclosure also relates to a process for producing the photosensitive binder composition. As shown in FIG. 2, the process comprises:

Step P1: mixing photopolymerizable monomer(s) containing at least one dipentaerythritol group, a photoinitiator, a levelling agent, solvent and an alkali soluble binder according to amounts discussed above, in a reactor, to give a mixture;

Step P2: adding a pigment to the mixed solution, and stirring the mixture to give a photosensitive binder composition.

According to an exemplary embodiment of the process for producing the photosensitive binder composition, if the pigment is a powder, it can be directly added into the mixed solution in powder form or added into the mixed solution in a dispersant form in the solvent, preferably added in a form of dispersant in the solvent. The mixing steps are both conducted under stirring.

In order to better understand the alkali soluble binder, the photosensitive binder composition and the processes for producing them of the invention, the following non-limiting examples are given for illustrating the invention.

EXAMPLES

Example 1

Preparation of Photosensitive Binder Composition 1

15 g methacrylic acid, 6 g methyl methacrylate, 22 g butyl methacrylate, 45 g benzyl methacrylate, 6 g maleic anhydride, 6 g stearyl methacrylate and 150 g propylene glycol monomethyl ether acetate were added into a 2000 ml four necked flask under stirring at room temperature; the reaction system was heated to 75° C. at a heating rate of 3° C./minute; then 3 g azodiisobutyronitrile was dissolved in 10 g propylene glycol monomethyl ether acetate, and the solution of azodiisobutyronitrile was added dropwise into the four necked flask within the first 15 minutes during heating the system; then 9 ml 1-dodecanethiol was added into the four necked flask for three times under stirring during heating the system; after the heating was finished, the system was stirred for another 6 hours at a temperature of 75° C., then cooled to room temperature and filtered to give an alkali soluble binder 1. According to the measurements of the alkali soluble binder 1, it has a weight average molecular weight of 14500, a viscosity of 130 cps.

75 g dipentaerythritol hexaacrylate, 12 g 2-benzyl-2,2 dimethylamino-1-(4-morpholinylphenyl)-1-butanone, 37 g propylene glycol monomethyl ether acetate, 5 g DEN438 novolac type epoxy resin and 200 g the resulting alkali soluble binder 1 were mixed in a vessel under stirring, and then 25 g G58 green pigment powder was added into the mixture at room temperature to give photosensitive binder composition 1.

Example 2

Preparation of Photosensitive Binder Composition 2

3 g methacrylic acid, 40 g methyl methacrylate, 10 g butyl methacrylate, 40 g benzyl methacrylate, 3 g maleic anhydride, 3 g stearyl methacrylate and 125 g propylene glycol monomethyl ether acetate were added into a 2000 ml four necked flask under stirring at room temperature; the reaction system was heated to 75° C. at a heating rate of 3° C./minute; then 3 g azodiisobutyronitrile was dissolved in 10 g propylene glycol monomethyl ether acetate, and the solution of azodiisobutyronitrile was added dropwise into the four necked flask within the first 15 minutes during heating the system; then 9 ml 1-dodecanethiol was added into the four necked flask for three times under stirring during heating the system; after the heating was finished, the system was stirred for another 7 hours at a constant temperature of 75° C., then cooled to room temperature and filtered to give an alkali soluble binder 2. According to the measurements of the alkali soluble binder 2, it has a weight average molecular weight of 15000, a viscosity of 140 cps.

75 g dipentaerythritol hexaacrylate, 12 g 2-benzyl-2,2 dimethylamino-1-(4-morpholinylphenyl)-1-butanone, 37 g propylene glycol monomethyl ether acetate, 5 g DEN438 novolac type epoxy resin and 200 g the resulting alkali soluble binder 2 were mixed in a vessel under stirring, and then 25 g G58 green pigment powder was added into the mixture at room temperature to give photosensitive binder composition 2.

Example 3

Preparation of Photosensitive Binder Composition 3

25 g methacrylic acid, 20 g methyl methacrylate, 35 g butyl methacrylate, 25 g benzyl methacrylate, 15 g maleic anhydride, 15 g stearyl methacrylate and 125 g propylene glycol monomethyl ether acetate were added into a 2000 ml four necked flask under stirring at room temperature; the reaction system was heated to 75° C. at a heating rate of 3° C./minute; 3 g azodiisobutyronitrile was dissolved in 10 g propylene glycol monomethyl ether acetate, and the solution of azodiisobutyronitrile was added dropwise into the four necked flask within the first 15 minutes during heating the system; then 9 ml 1-dodecanethiol was added into the four necked flask for three times under stirring during heating the system; after the heating was finished, the system was stirred for 8 hours at a constant temperature of 75° C., then cooled to room temperature and filtered to give an alkali soluble binder 3. According to the measurements of the alkali soluble binder 3, it has a weight average molecular weight of 14000, a viscosity of 120 cps.

75 g dipentaerythritol hexaacrylate, 12 g 2-benzyl-2,2 dimethylamino-1-(4-morpholinylphenyl)-1-butanone, 37 g propylene glycol monomethyl ether acetate, 5 g DEN438 novolac type epoxy resin and 200 g the resulting alkali soluble binder 3 were mixed in a vessel under stirring, and then 25 g G58 green pigment powder was added into the mixture at room temperature to give photosensitive binder composition 3.

Example 4

Preparation of Photosensitive Binder Composition 4

15 g methacrylic acid, 28 g methyl methacrylate, 22 g butyl methacrylate, 35 g benzyl methacrylate, and 125 g propylene glycol monomethyl ether acetate were added into a 2000 ml four necked flask under stirring at room temperature; the reaction system was heated to 75° C. at a heating rate of 3° C./minute; 3 g azodiisobutyronitrile was dissolved in 10 g propylene glycol monomethyl ether acetate, and the solution of azodiisobutyronitrile was added dropwise into the four necked flask within the first 15 minutes during heating the system; then 9 ml 1-dodecanethiol was added into the four necked flask for three times under stirring during heating the system; after the heating was finished, the system was stirred for 7 hours at a constant temperature of 75° C., then cooled to room temperature and filtered to give an alkali soluble binder 4. According to the measurements of the alkali soluble binder 4, it has a weight average molecular weight of 11000, a viscosity of 110 cps.

75 g dipentaerythritol hexaacrylate, 12 g 2-benzyl-2,2 dimethylamino-1-(4-morpholinylphenyl)-1-butanone, 37 g propylene glycol monomethyl ether acetate, 5 g DEN438 novolac type epoxy resin and 200 g the resulting alkali soluble binder 4 were mixed in a vessel under stirring, and then 25 g G58 green pigment powder was added into the mixture at room temperature to give photosensitive binder composition 4.

Performance Tests of Photosensitive Binder Compositions

1) Development Effect

The prepared photosensitive binder compositions 1, 2, 3 and 4 were coated, prebaked, exposed and then developed in 0.042% development solution.

If the development time is more than 90 s, the photosensitive binder composition is deemed to have an unsatisfactory performance; if the development time is from 60 s to 90 s, the photosensitive binder composition is deemed to have a modest development performance; if the development time is less than 60 s, the photosensitive binder composition is deemed to have an excellent development performance. The results are shown in Table 1.

2) Margin and Surface Effect

The prepared photosensitive binder compositions 1, 2, 3 and 4 were coated, prebaked, exposed, developed and postbaked, and the margin and surface effect of the obtained films were observed by using microscope and SEM. The results are shown in Table 1.

3) Chroma

The prepared photosensitive binder compositions 1, 2, 3 and 4 were coated, prebaked, exposed, developed and postbaked and the obtained films were subjected to a chroma test in colorimeter. The results are shown in Table 1.

TABLE 1

| | The results of the experiments | | | |
|---|---|---|---|---|
| | Development effect | The surface after high temperature postbaking | Margin | Chroma |
| Example 1 | ○○ | ○○ | ○○ | ○○ |
| Example 2 | ○○ | ○ | ○○ | ○○ |
| Example 3 | ○○ | ○ | ○ | ○○ |
| Comparative Example | x | x | ○ | ○○ |

Note:
x denotes unsatisfactory effect,
○ denotes modest effect,
○○ denotes excellent effect.

It can be seen from Table 1 that, for the compositions of Examples 1, 2 and 3, the development effects, the surface after high temperature postbaking and the neat degree of edge are better than that of the composition of Comparative Example; the main reasons are that the alkali soluble binder in Comparative Example is obtained by polymerizing only the main polymerization monomers, while the alkali soluble binders of Examples 1, 2 and 3 are obtained by polymerizing the main polymerization monomers and the functional polymerization monomers. Since the functional polymerization monomer(s) can introduce alkyl of long chain and anhydride into the alkali soluble binder to adjust its polymerization degree and viscosity, such that not only the problems such as poor heat resistance, rough pixel surface, marginal residue are resolved, but also a neutralization reaction between the alkali soluble binder and the alkali solvent during the course of alkali development can be conducted so as to improve the development effect of alkali soluble binder. Therefore, when a G58 green pigment powder having a smaller particle size is dispersed in the alkali soluble binder, a photosensitive binder composition having superior properties can be formed.

Although the present disclosure has been described with reference to specific embodiments, it should be understood that the limitations of the described embodiments are provided merely for purpose of illustration and are not intended to limit the present invention and associated general inventive concepts. Instead, the scope of the present invention is defined by the appended claims, and all variations and equivalents that fall within the range of the claims are intended to be embraced therein. Thus, other embodiments than the specific exemplary ones described herein are equally possible within the scope of these appended claims.

The invention claimed is:

1. An alkali soluble binder comprising the reaction product of a main polymerization monomer and a functional polymerization monomer, wherein said main polymerization monomer is selected from (meth)acrylic acid and (meth)acrylic esters, wherein the (meth)acrylic esters are selected from the group consisting of (meth)acrylic acid C1-C6 alkyl ester and (meth)acrylic acid C7-C10 aralkyl ester, and mixtures thereof, wherein said functional polymerization monomer is selected from (meth)acrylic acid C14-C22 alkyl ester and a C4-C6 alkenyl anhydride, wherein the alkali soluble binder is prepared by the copolymerization of the monomers of the following percent contents, relative to the total weight of said monomers:
(meth)acrylic acid: 3 to 25%;
(meth)acrylic acid C1-C6 alkyl ester: 13% to 75%;
(meth)acrylic acid C7-C10 aralkyl ester: 10% to 50%;
(meth)acrylic acid C14-C22 alkyl ester: 0.75% to 30%;
C4-C6 alkenyl anhydride: 3% to 15%.

2. The alkali soluble binder according to claim 1, wherein the ratio by weight of the (meth)acrylic acid C14-C22 alkyl ester to the C4-C6 alkenyl anhydride is from 2:1 to 1:4.

3. The alkali soluble binder according to claim 1, wherein the (meth)acrylic acid C14-C22 alkyl ester is stearyl methacrylate.

4. The alkali soluble binder according to claim 1, wherein the C4-C6 alkenyl anhydride is maleic anhydride.

5. The alkali soluble binder according to claim 1, wherein the main polymerization monomer comprises methacrylic acid, methyl methacrylate, butyl methacrylate and benzyl methacrylate.

6. The alkali soluble binder according to claim 5, wherein the alkali soluble binder comprises the reaction product of the following monomers:
methacrylic acid: 3 to 25%;
methyl methacrylate: 3% to 40%;
butyl methacrylate: 10% to 35%;
benzyl methacrylate: 10% to 50%;
stearyl methacrylate: 0.75% to 30%
maleic anhydride: 3% to 15%;
wherein the sum of the above percentages is 100% based on the total weight of the monomers.

7. The alkali soluble binder according to claim 1, wherein the alkali soluble binder has a weight-average molecular weight of 8000 to 25000.

8. The alkali soluble binder according to claim 1, wherein the alkali soluble binder has a solid acid value of 400±10.

9. The alkali soluble binder according to claim 1, wherein the alkali soluble binder has a viscosity of 120-150 cps.

10. A process for preparing the alkali soluble binder according to claim 1, comprising:
combining the main polymerization monomer, the functional polymerization monomer and a solvent in a reactor to form a mixture;
adding an azo thermal initiator into the reactor while heating the mixture;
adding a molecular weight regulator while heating the mixture; and
stirring the system for sufficient time at a constant temperature after heating to give an alkali soluble binder.

11. The process according to claim 10, comprising:
adding methacrylic acid, methyl methacrylate, butyl methacrylate, benzyl methacrylate, maleic anhydride, stearyl methacrylate and propylene glycol monomethyl ether acetate into the reactor at room temperature while stirring;
adding an azo thermal initiator dropwise into the reactor within the first 15 minutes while heating the mixture;
adding a molecular weight regulator in at least one portion into the reactor while heating the reaction system;
stirring the system for at least 2 hours at a constant temperature after heating the reaction system; and
cooling the system to room temperature, and filtering the mixture to give an alkali soluble binder.

12. A photosensitive binder composition comprising at least one alkali soluble binder according to claim 1, wherein the photosensitive binder composition further comprises a photopolymerizable monomer containing at least one dipentaerythritol group, a photoinitiator, a solvent, a pigment, at least one alkali soluble binder, and optionally a levelling agent.

13. The photosensitive binder composition according to claim 12, wherein said photosensitive binder composition comprises: 30 to 50% of a photopolymerizable monomer containing at least one dipentaerythritol group, less than 10% of a photoinitiator, less than 5% of a levelling agent, less than 40% of a solvent, 30 to 60% of the at least one alkali soluble binder and less than 20% of pigment.

14. A process for preparing the photosensitive binder composition according to claim 13, comprising:
mixing the photopolymerizable monomer containing at least one dipentaerythritol group, the photoinitiator, the solvent, the alkali soluble binder, and optionally a levelling agent into a reactor to give a mixed solution; and
adding pigment into the mixed solution under stirring to give the photosensitive binder composition.

* * * * *